United States Patent
Lin

(10) Patent No.: US 8,659,327 B2
(45) Date of Patent: *Feb. 25, 2014

(54) HIGH VOLTAGE SUSTAINABLE OUTPUT BUFFER

(71) Applicant: Macronix International Co., Ltd., Hsinchu (TW)

(72) Inventor: Yung-Feng Lin, Taoyuan County (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/746,374

(22) Filed: Jan. 22, 2013

(65) Prior Publication Data

US 2013/0135028 A1 May 30, 2013

Related U.S. Application Data

(63) Continuation of application No. 12/789,579, filed on May 28, 2010, now Pat. No. 8,446,182.

(60) Provisional application No. 61/266,532, filed on Dec. 4, 2009.

(51) Int. Cl.
*H03K 3/00* (2006.01)

(52) U.S. Cl.
USPC .................................................... 327/108

(58) Field of Classification Search
USPC .................................................. 327/108–112
See application file for complete search history.

(56) References Cited

U.S. PATENT DOCUMENTS 5,831,449 A * 11/1998 Shigehara et al. ............. 326/81

* cited by examiner

*Primary Examiner* — Daniel Rojas
(74) *Attorney, Agent, or Firm* — McClure, Qualey & Rodack, LLP

(57) ABSTRACT

An output buffer includes a first output transistor, a first switch, a second switch and a third switch. The first output transistor is connected to a first operational voltage for outputting the first operational voltage as the data signal. The first switch is connected to a bulk of the first output transistor for receiving an enable signal. The second switch is connected to the first switch and a second operational voltage for receiving the enable signal, wherein the second operational voltage is lower than the first operational voltage. The third switch includes a first terminal connected to the bulk of the first output transistor, a control terminal connected to the first switch, and a second terminal connected to the first operational voltage.

20 Claims, 3 Drawing Sheets

— 1 —

HIGH VOLTAGE SUSTAINABLE OUTPUT BUFFER

This application is a continuation application of U.S. patent application Ser. No. 12/789,579, filed May 28, 2010, now U.S. Pat. No. 8,446,182, which claims the benefit of U.S. provisional application Ser. No. 61/266,532, filed Dec. 4, 2009, the contents of which are incorporated herein by reference.

BACKGROUND OF THE INVENTION

1. Field of the Invention

The invention relates in general to an output buffer of a semiconductor device, and more particularly to a high-voltage-sustainable output buffer of a semiconductor device.

2. Description of the Related Art

FIG. 1 shows a circuit diagram of an output buffer 100 in a SIO pad of a conventional flash memory. When the enable signal Z=1 (ZB=0), the output buffer 100 is in an active mode. The N-type metal-oxide-semiconductor (NMOS) transistor MN5 and the P-type metal-oxide-semiconductor (PMOS) transistor MP5 are both turned on, while the PMOS transistor MP3 and the NMOS transistor MN3 are both turned off. If the inputted data DATA=0, the PMOS transistor MP3A is turned on to output the voltage VDD to the node PU0 while the NMOS transistor MN3A is turned off. Since the transistor MN5 is turned on, the node PD0 has the same voltage VDD as the node PU0. As a result, the PMOS transistor MP0 is turned off by the gate voltage VDD while the NMOS transistor MN0 is turned on by the gate voltage VDD to output VSS (e.g. GND) as a data signal DQ (=DATA=0).

If the inputted data DATA=1, the transistor MP3A is turned off while the transistor MN3A is turned on to output the voltage VSS to the node PD0. Since the transistor MP5 is turned on, the node PU0 has the same voltage VSS as the node PD0. As a result, the transistor MN0 is turned off by the gate voltage VSS while the transistor MP0 is turned on by the gate voltage VSS to output VDD as the data signal DQ (=DATA=1).

When the enable signal Z=0 (ZB=1), the output buffer 100 is in a tri-state mode, the transistor MN5 and MP5 are both turned off such that the nodes PU0 and PD0 are both floating and the transistors MP0 and MN0 are both turned off. At the time, the data signal DQ is floating and the output buffer 100 is disabled. Owing that the transistor MP0 has fixed the bulk voltage to VDD as shown in FIG. 1, when an external high voltage (HV) larger than VDD is inputted to an output terminal of the transistor MP0, the voltage of the output terminal (i.e. the drain voltage of MP0) cannot be lifted up to HV due to turning on of the PN junction (drain P+ region to N-well) in the transistor MP0.

As such, the output buffer 100 of the conventional serial flash memory cannot work as a tri-state output buffer with an input high voltage larger than VDD. How to design a novel output buffer sustainable for high voltage input has become essential.

SUMMARY OF THE INVENTION

The invention is directed to an output buffer of a semiconductor device. The output buffer includes a switch circuit connected to the bulk of an output transistor. When in an active mode, the switch circuit is turned on to supply a voltage equal to an operational voltage of the output transistor to the bulk of the output transistor. When in a tri-state mode and an external high voltage is applied to an output terminal of the output transistor, the switch circuit is turned off and a control-terminal voltage and the bulk voltage of the output transistor are both lifted up to completely turn off the output transistor. In this way, the output buffer can be high voltage sustainable in the tri-state mode without affecting the normal operation in an active mode.

According to a first aspect of the present invention, an output buffer is provided. The output buffer is applied in a semiconductor device for outputting a data signal according to an enable signal and input data. The output buffer includes a first output transistor, a first switch, a second switch and a third switch. The first output transistor includes a first terminal coupled to a first operational voltage and a second terminal for outputting the first operational voltage as the data signal. The first switch includes a first terminal coupled to a bulk of the first output transistor, and a control terminal receiving the enable signal. The second switch includes a first terminal coupled to a second terminal of the first switch, a control terminal receiving the enable signal, and a second terminal coupled to a second operational voltage, wherein the second operational voltage is lower than the first operational voltage. The third switch includes a first terminal coupled to the bulk of the first output transistor, a control terminal coupled to the second terminal of the first switch, and a second terminal coupled to the first operational voltage.

According to a second aspect of the present invention, an output buffer is provided. The output buffer applied in a semiconductor device for outputting a data signal according to an enable signal and input data. The output buffer comprises a first output transistor, a switch circuit and a first transistor. The first output transistor comprises a first terminal coupled to a first operational voltage and a second terminal for outputting the first operational voltage as the data signal. The switch circuit is coupled to the first operational voltage and a bulk of the first output transistor. The first transistor comprises a first terminal coupled to the bulk of the first output transistor, a control terminal coupled to the enable signal, and a second terminal coupled to a control terminal of the first output transistor. When a high voltage larger than the first operational voltage is applied to the second terminal of the first output transistor in a tri-state mode, the first output transistor has a bulk voltage being lifted up toward the high voltage, the switch circuit is turned off and the first transistor is turned on by the enable signal to pass the bulk voltage to the control terminal of the first output transistor.

The invention will become apparent from the following detailed description of the preferred but non-limiting embodiments. The following description is made with reference to the accompanying drawings.

DETAILED DESCRIPTION OF THE INVENTION

The invention is directed to an output buffer of a semiconductor device. The output buffer includes a switch circuit connected to a bulk of an output transistor such that a bulk voltage of the output transistor is equal to an operational voltage of the output transistor under an active mode and equal to an external high voltage applied to an output terminal of the output transistor under a tri-state mode. In this way, the output buffer can be high voltage sustainable in the tri-state mode without affecting the normal operation in an active mode.

Embodiment One

Figure 2:
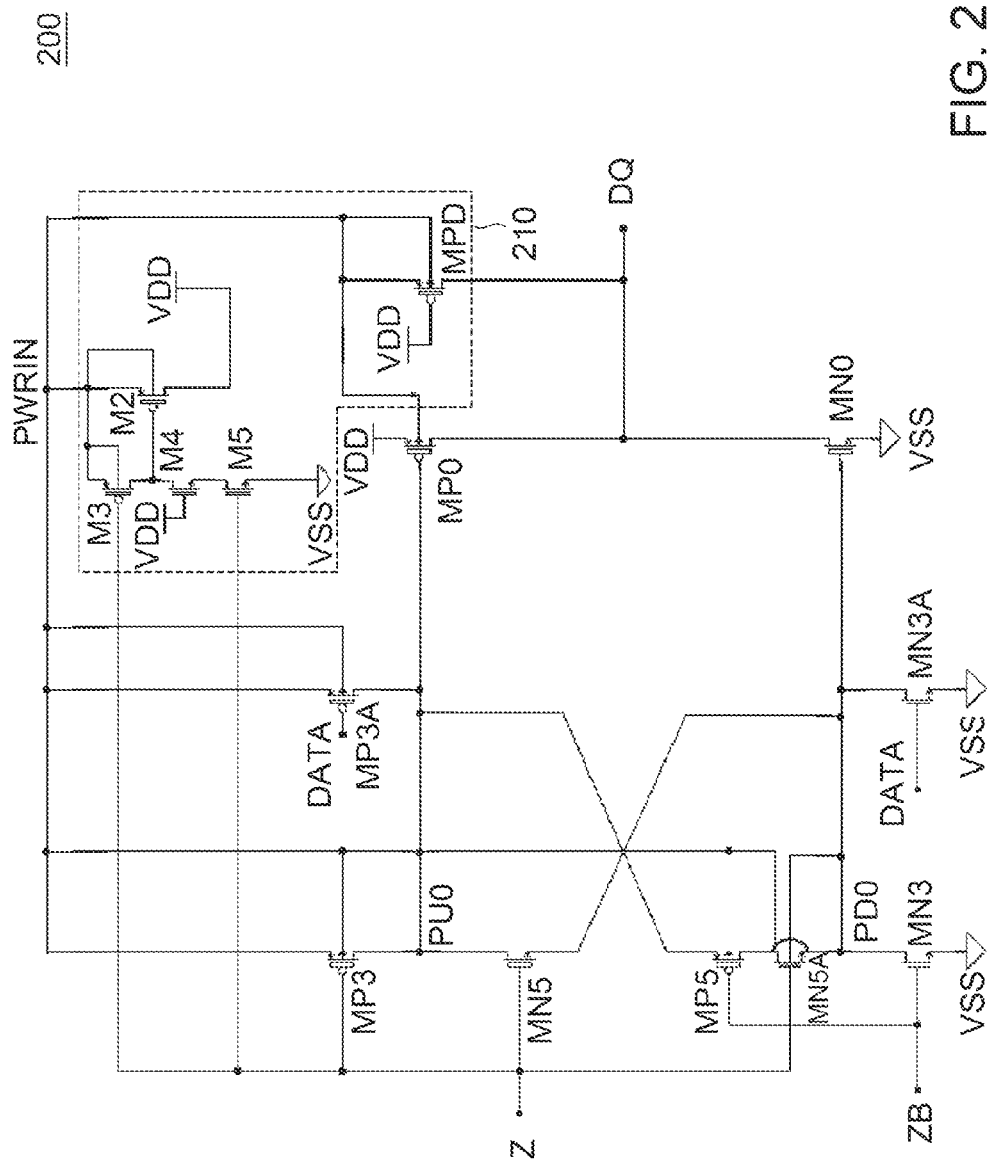
FIG. 2 is a circuit diagram of an output buffer according to a first embodiment of the invention.

Referring to FIG. 2, a circuit diagram of an output buffer according to a first embodiment of the invention is shown. The output buffer 200 is applied to a semiconductor device, such as a non-volatile flash memory, for outputting a data signal DQ according to an enable signal Z and input data DATA. The output buffer 200 includes a first output transistor MP0 and a switch circuit 210. For example, the first output transistor MP0 is a PMOS transistor. The first output transistor MP0 has a first terminal (i.e. a source) connected to a first operational voltage VDD, and a second terminal (i.e. a drain) for outputting the first operational voltage VDD as the data signal DQ.

The feature of the embodiment lies in the bulk of the first output transistor MP0 is connected to the switch circuit 210 in stead of the first operational voltage VDD. When the output buffer 200 is in an active mode, the switch circuit 210 is turned on to output the first operational voltage VDD to the bulk of the first output transistor MP0. When the output buffer 200 is in a tri-state mode for a high voltage input, i.e. a high voltage HV larger than VDD is inputted to the second terminal (output terminal) of the first output transistor MP0, the switch circuit 210 is turned off and the bulk voltage of the first output transistor MP0 is lifted up to the high voltage HV so that a voltage of the second terminal of the first output transistor MP0 can be successfully lifted up to the high voltage HV with the first output transistor MP0 being completely turned off.

The switch circuit 210 includes a first switch, such as a PMOS transistor M3, a second switch, such as an NMOS transistor M5, a third switch, such as a PMOS transistor M2, a fourth switch, such as a NMOS transistor M4, and a fifth switch, such as a PMOS transistor MPD. The first switch (M3) has a first terminal (i.e. a source) connected to a bulk of the first output transistor MP0, and a control terminal (i.e. a gate) for receiving the enable signal Z. The fourth switch (M4) includes a first terminal (i.e. a drain) connected to the second terminal of the first switch (M3) and a control terminal (i.e. a gate) receiving the first operational voltage VDD. The second switch (M5) includes a first terminal (i.e. a drain) connected to a second terminal (i.e. a source) of the fourth switch (M4), a control terminal (i.e. a gate) receiving the enable signal Z and a second terminal (i.e. a source) connected to a second operational voltage VSS, wherein the second operational voltage VSS (e.g. GND) is lower than the first operational voltage VDD (e.g. 3.0V).

The third switch (M2) includes a first terminal (i.e. a source) connected to the bulk of the first output transistor MP0, a control terminal (i.e. a gate) connected to the second terminal of the first switch (M3), and a second terminal (i.e. drain) connected to the first operational voltage VDD. The fifth switch (MPD) includes a first terminal (i.e. a source) connected to the bulk of the first output transistor MP0, a control terminal (i.e. a gate) receiving the first operational voltage VDD, and a second terminal (i.e. a drain) connected to the second terminal of the first output transistor MP0.

Figure 1:
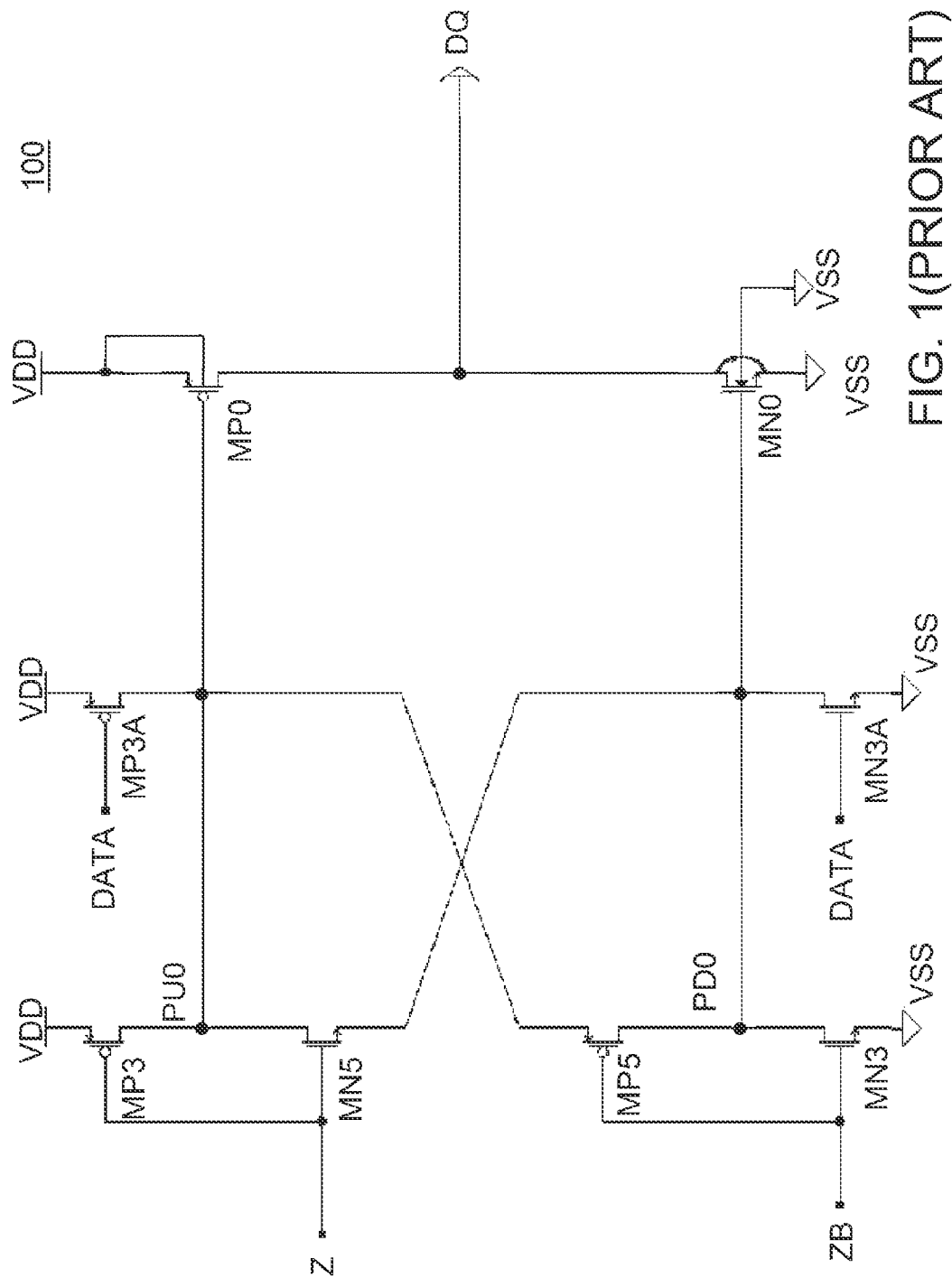
FIG. 1 is a circuit diagram of an output buffer in a conventional flash memory.

When the output buffer 200 is in an active mode, the enable signal Z has a first level VDD, i.e. Z=1, the first switch (M3) is turned off and the second switch (M5) and the fourth switch (M4) are both turned on to pass the second operational voltage VSS to turn on the third switch (M2) so that the bulk of the first output transistor MP0 has a bulk voltage PWRIN equal to the first operational voltage VDD, that is, the source and bulk of the first output transistor MP0 are both connected to VDD, similar to those of the transistor MP0 in the prior-art output buffer 100 of FIG. 1.

When the enable signal Z has a second level VSS, i.e. Z=0, in a tri-state mode and a high voltage HV (e.g. 10V) larger than the first operational voltage VDD (e.g. 3V) is applied to the second terminal of the first output transistor MP0 to lift up the bulk voltage PWRIN toward the high voltage HV, the fifth switch (MPD) is completely turned on to equalize the bulk voltage PWRIN to the high voltage HV. At the time, the second switch (M5) and the fourth switch (M4) are both turned off and the first switch (M3) is turned on to pass the bulk voltage PWRIN (=HV) to turn off the third switch (M2).

Different from the prior-art output buffer 100 in which the bulk voltage of the output transistor MP0 is fixed to VDD, the bulk voltage of the output transistor MP0 in the output buffer 200 can be lifted up to the high voltage HV along with the output voltage of the output transistor MP0 being lifted up to the high voltage HV. Therefore, the output buffer of the embodiment can be high voltage sustainable in the tri-state mode.

Although the switch circuit 210 is exemplified to include the fourth switch (M4) connected between the first switch (M3) and the second switch (M5) and controlled by VDD in the embodiment, the switch circuit 210 can also include the first switch (M3) directly connected to the second switch (M5) without using the fourth switch (M4). Further, the switch circuit 210 can also be designed without using the fifth switch (MPD). In this case, when the high voltage HV is applied to the second terminal of the first output transistor MP0, the bulk voltage PWRIN of the first output transistor MP0 is lifted up to (HV−Vd), wherein Vd is the diode drop voltage of the reverse-biased diode in MP0. As long as the first output transistor can have the bulk voltage to be lifted up close to the high voltage along with a voltage of the second terminal increasing to the high voltage, all the alternatives are not apart from the scope of the invention if the threshold voltage of the first output transistor is larger than the diode drop voltage in order to cut off the leakage current through the first output transistor.

As shown in FIG. 2, the output buffer 200 further includes a first transistor MP3, a second transistor MP3A, a third transistor MP5, a fourth transistor MN5A, a fifth transistor MN5 and a second output transistor MN0. For example, the transistors MP3, MP3A and MP5 are PMOS transistors while the transistors MN5A, MN5 and MN0 are NMOS transistors. The first transistor MP3 includes a first terminal, i.e. a source, connected to the bulk of the first output transistor MP0, a control terminal, i.e. a gate, receiving the enable signal Z, and a second terminal, i.e. a drain, connected to a control terminal (i.e. a gate) of the first output transistor MP0.

The second transistor MP3A includes a first terminal, i.e. a source, connected to the bulk of the first output transistor MP0, a control terminal, i.e. a gate, receiving the input data DATA, and a second terminal, i.e. a drain, connected to the control terminal of the first output transistor MP0. A bulk of the first transistor MP3 and a bulk of the second transistor MP3A are both connected to the bulk of the first output transistor MP0. When the enable signal Z has the second level VSS, i.e. Z=0, and the high voltage HV is applied to the second terminal of the first output transistor MP0, the first transistor MP3 is turned on to pass the bulk voltage PWRIN (~HV) of the first output transistor MP0 to the control terminal of the first output transistor MP0 to turn off the first output transistor MP0.

The third transistor MP5 includes a first terminal, i.e. a source, connected to the control terminal (PU0) of the first output transistor MP0 and a control terminal, i.e. a gate, receiving an inverted signal ZB of the enable signal Z. The fourth transistor MN5A includes a first terminal connected to a second terminal of the third transistor MP5, and a control terminal, i.e. a gate, receiving the enable signal Z.

The second output transistor MN0 includes a first terminal, i.e. a drain, connected to the second terminal of the first output transistor MP0, a control terminal (PD0), i.e. a gate, connected to a second terminal of the fourth transistor MN5A, and a second terminal, i.e. a source, connected to the second operational voltage VSS. A bulk of the third transistor MP5 is connected to the bulk of the first output transistor MP0. A bulk of the fourth transistor MN5A is connected to the control terminal (PD0) of the second output transistor MN0.

Besides, the output buffer 200 further includes a sixth transistor MN3 and a seventh transistor MN3A. For example, the transistors MN3 and MN3A are both NMOS transistors. The sixth transistor MN3 has a drain connected to the control terminal PD0 of the second output transistor MN0, a gate connected to the inverted signal ZB and a source connected to the second operational voltage VSS. The seventh transistor MN3A has a drain connected to the control terminal PD0 of the second output transistor MN0, a gate connected to the input data DATA, and a source connected to the second operational voltage VSS.

When the enable signal Z has the first level VDD, i.e. Z=1, in the active mode, as mentioned above, the bulk voltage PWRIN is equal to the operational voltage VDD. At the time, the first transistor MP3 and the sixth transistor MN3 are turned off, while the third transistor MP5, the fourth transistor MN5A and the fifth transistor MN5 are turned on. If DATA=1, the second transistor MP3A is turned off and the seventh transistor MN3A is turned on to pass the operational voltage VSS to the node PD0 so that the second output transistor MN0 is turned off. At the same time, the operational voltage VSS is passed to the node PU0 through the turned-on transistors MP5 and MN5A so that the first output transistor MP0 is turned on to output the voltage VDD as the data signal DQ (=DATA=1). If DATA=0, the seventh transistor MN3A is turned off and the second transistor MP3A is turned on to pass the bulk voltage PWRIN (=VDD) to the node PU0 so that the first output transistor MP0 is turned off. At the same time, the bulk voltage PWRIN (=VDD) is passed to the node PD0 through the turned-on transistors MP5 and MN5A to the node PD0 so that the second output transistor MN0 is turned on to output the voltage VSS as the data signal DQ (=DATA=0).

When the enable signal Z has the second level VSS, i.e. Z=0, in the tri-state mode, and the high voltage HV is applied to the second terminal of the first output transistor MP0, as mentioned above, the bulk voltage PWRIN is equal to the high voltage HV, the first transistor MP3 is turned on to pass the bulk voltage PWRIN (=HV) to the node PU0 so that the first output transistor MP0 is turned off. At the time, the fifth transistor MN5 is turned off, but the third transistor MP5 cannot be completely turned off owing that the gate voltage (VDD) is much lower than the drain voltage (HV) of the third transistor MP5. However, the embodiment uses the fourth transistor MN5A to connect between the control terminal (PU0) of the first output transistor MP0 and the control terminal (PD0) of the second output transistor MN0 such that the fourth transistor MN5A can be completely turned off to block the bulk voltage PWRIN from inputting to the control terminal (PD0) of the second output transistor MN0 from the node PU0 to turn on the second output transistor MN0.

In this embodiment, the fourth transistor MN5A is a native transistor having a threshold voltage substantially equal to 0 in order to make sure the node PD0 has the voltage VDD, i.e. PD0=1 under the active mode with DATA=0.

The output buffer 200 includes the switch circuit 210 connected to a bulk of the first output transistor MP0 such that a bulk voltage of the first output transistor MP0 is equal to the operational voltage VDD of the first output transistor MP0 under an active mode and equal to the high voltage HV applied to the output terminal of the first output transistor MP0 under the tri-state mode. Therefore, the output buffer 200 can be high voltage sustainable in the tri-state mode without affecting the normal operation in an active mode.

Embodiment Two

Figure 3:
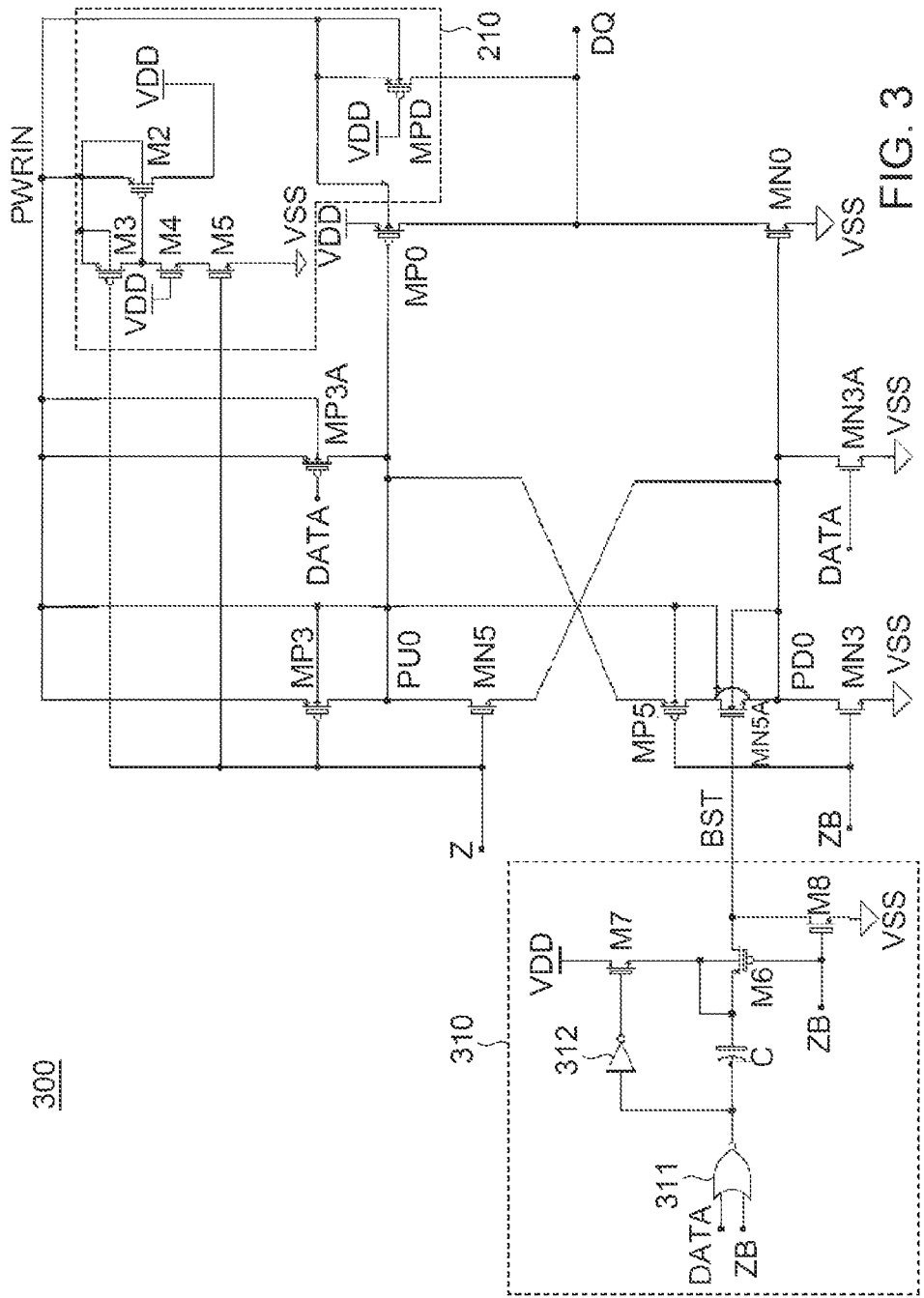
FIG. 3 is a circuit diagram of an output buffer according to a second embodiment of the invention.

Referring to FIG. 3, a circuit diagram of an output buffer according to a second embodiment of the invention is shown. The output buffer 300 of the second embodiment has a circuit structure similar to that of the output buffer 200. The difference between the output buffer 300 and the output buffer 200 lies in that the output buffer 300 further includes a boost circuit 310 connected to the control terminal of the fourth transistor MN5A and the fourth transistor MN5A has a threshold voltage not equal to 0, e.g. 1.0V.

For example, the boost circuit 310 includes a NOR gate 311, a PMOS transistor M6, two NMOS transistors M7 and M8, and an inverter 312. The NOR gate 311 has two input terminals respectively connected to the input data DATA and the inverted signal ZB. The transistor M6 has a gate connected to the inverted signal ZB, a drain connected to an output terminal of the NOR gate 311 through a capacitor C and a source connected to the control terminal of the fourth transistor MN5A. The inverter 312 has an input terminal connected to the output terminal of the NOR gate 311. The transistor M7 has a gate connected to an output terminal of the inverter 312, a drain connected to the operational voltage VDD and a source connected to the drain of the transistor M6. The transistor M8 has a gate connected to the inverted signal ZB, a drain connected to the source of the transistor M6, and a source connected to the operational voltage VSS, e.g. 0V.

When the enable signal Z has the second level VSS, i.e. Z=0 and ZB=1, in the tri-state mode, no matter the input data DATA is 1 or 0, the transistor M6 is turned off and the transistor M8 is turned on to output the operational voltage VSS as the boost voltage BST to the control terminal of the fourth transistor MN5A to turn off the fourth transistor MN5A.

When the enable signal Z has the first level VDD, i.e. Z=1 and ZB=0, in the active mode, the transistor M8 is turned off and the transistor M6 is turned on. If the input data DATA has a high level, i.e. DATA=1, the output voltage of the NOR gate 311 is VSS and the gate voltage of the transistor M7 is VDD. Thus, the transistor M7 is turned on to output the operational voltage VDD to the control terminal of the fourth transistor MN5A via the turned-on transistor M6 to turn on the fourth transistor MN5A. If the input data DATA changes to have a low level, i.e. DATA=0, the output voltage of the NOR gate 311 is VDD and the gate voltage of the transistor M7 is VSS. The transistor M7 is turned off and the drain voltage of the transistor M6 is lifted up to VDD+(VDD−Vt−VSS)=2VDD−Vt−VSS due to the storage voltage (VDD−Vt−VSS) in the capacitor C in a previous stage as DATA=1 where Vt is the threshold voltage of M7. The turned-on transistor M6 outputs the voltage (2VDD−Vt−VSS) (e.g. 2*3V−1V−0V=5V) to completely turn on the fourth transistor MN5A so that the fourth transistor MN5A can output a voltage equal to the first operational voltage VDD without a voltage drop of the threshold voltage. In this way, it can be ensured that the second output transistor MN0 can be completely turned on to output the operational voltage VSS as the data signal DQ under the active mode with DATA=0.

Although the boost circuit 310 is exemplified to include the NOR gate 311, the inverter 312, and the transistors M6-M8 in the embodiment, any other type of boost circuit can also be used in the invention. As long as the boost circuit can output a voltage to turn off the fourth transistor under the tri-state mode (Z=0) and output a voltage higher than the first operational voltage to completely turn on the fourth transistor to output the first operational voltage without the voltage drop of a threshold voltage, all the alternatives are not apart from the scope of the invention.

Similar to the output buffer 200, the output buffer 300 includes the switch circuit 210 connected to a bulk of the first output transistor MP0 and thus can be high voltage sustainable in the tri-state mode without affecting the normal operation in an active mode.

The output buffer disclosed by the above embodiments of the invention uses a switch circuit connected to a bulk of the first output transistor to enable a bulk voltage of the first output transistor equal to a first operational voltage of the first output transistor under an active mode and equal to an external high voltage applied to an output terminal of the first output transistor under a tri-state mode. In this way, the output buffer can be high voltage sustainable in the tri-state mode without affecting the normal operation in an active mode.

Besides, the output buffer uses a transistor, which is native or integrated with a boost circuit, to connect between control terminals of the first output transistor and a second output transistor. Under the tri-state mode, the transistor can be completely turned off to block the external high voltage from inputting to the control terminal of the second output transistor, while under the active mode with DATA=0, the transistor is turned on to output the first operational voltage to the control terminal of the second output transistor.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An output buffer applied in a semiconductor device for outputting a data signal according to an enable signal and input data, comprising:
   a first output transistor, comprising a first terminal coupled to a first operational voltage and a second terminal for outputting the first operational voltage as the data signal;
   a first switch, comprising:
      a first terminal coupled to a bulk of the first output transistor; and
      a control terminal receiving the enable signal;
   a second switch, comprising:
      first terminal coupled to a second terminal of the first switch;
      a control terminal receiving the enable signal; and
      a second terminal coupled to a second operational voltage;
   a third switch, comprising:
      a first terminal coupled to the bulk of the first output transistor;
      a control terminal coupled to the second terminal of the first switch; and
      a second terminal coupled to the first operational voltage, and
   a fourth switch including a first terminal coupled to the first switch and a second terminal coupled to the second switch and the fourth switch is controlled by the first operational voltage, wherein when the enable signal has a first level, the fourth switch is turned on and when the enable signal has a second level, the fourth switch is turned off.

2. The output buffer according to claim 1, wherein when the enable signal has the first level, the first switch is turned off and the second switch is turned on to pass the second operational voltage to turn on the third switch so that the bulk of the first output transistor has a bulk voltage equal to the first operational voltage.

3. The output buffer according to claim 2, wherein when the enable signal has the second level and a high voltage larger than the first operational voltage is applied to the second terminal of the first output transistor to lift up the bulk voltage toward the high voltage, the second switch is turned off and the first switch is turned on to pass the bulk voltage to turn off the third switch.

4. The output buffer according to claim 1, further comprising a fifth switch, wherein the fifth switch comprises:
   a first terminal coupled to the bulk of the first output transistor;
   a control terminal coupled to the first operational voltage; and
   a second terminal coupled to the second terminal of the first output transistor, wherein when the enable signal has the first level, the fifth switch is turned off and when the enable signal has the second level, the fifth switch is turned on to pass the high voltage to the bulk of the first output transistor.

5. The output buffer according to claim 3, further comprising:
   a first transistor, comprising:
      a first terminal coupled to the bulk of the first output transistor;
      a control terminal receiving the enable signal; and
      a second terminal coupled to a control terminal of the first output transistor; and
   a second transistor, comprising:
      a first terminal coupled to the bulk of the first output transistor;
      a control terminal receiving the input data; and
      a second terminal coupled to the control terminal of the first output transistor;
   wherein a bulk of the first transistor and a bulk of the second transistor are coupled to the bulk of the first output transistor.

6. The output buffer according to claim 5, further comprising:
   a third transistor, comprising:
      a first terminal coupled to the control terminal of the first output transistor; and
      a control terminal receiving an inverted signal of the enable signal;
   a fourth transistor, comprising:
      a first terminal coupled to a second terminal of the third transistor; and
      a control terminal receiving the enable signal; and
   a second output transistor, comprising:
      a first terminal coupled to the second terminal of the first output transistor;
      a control terminal coupled to a second terminal of the fourth transistor; and a second terminal coupled to the second operational voltage;

wherein a bulk of the third transistor is coupled to the bulk of the first output transistor.

7. The output buffer according to claim 6, wherein when the enable signal has the first level, the third transistor and the fourth transistor are turned on, and when the enable signal has the second level and the high voltage is applied to the second terminal of the first output transistor, the fourth transistor is turned off to block the bulk voltage from inputting to the control terminal of the second output transistor to turn on the second output transistor.

8. The output buffer according to claim 6, wherein the fourth transistor is a native transistor having a threshold voltage substantially equal to 0.

9. The output buffer according to claim 6, further comprising a boost circuit coupled to the control terminal of the fourth transistor, wherein when the enable signal has the second level, the boost circuit outputs the second operational voltage to the control terminal of the fourth transistor to turn off the fourth transistor, and when the enable signal has the first level and the input data has a low level, the boost circuit outputs a voltage to completely turn on the fourth transistor so that the fourth transistor outputs the first operational voltage.

10. The output buffer according to claim 6, wherein a bulk of the fourth transistor is coupled to the control terminal of the second output transistor.

11. An output buffer applied in a semiconductor device for outputting a data signal according to an enable signal and input data, comprising:
a first output transistor, comprising a first terminal coupled to a first operational voltage and a second terminal for outputting the first operational voltage as the data signal;
a first switch, comprising:
a first terminal coupled to a bulk of the first output transistor; and
a control terminal receiving the enable signal;
a second switch, comprising:
a first terminal coupled to a second terminal of the first switch;
a control terminal receiving the enable signal; and
a second terminal coupled to a second operational voltage; and
a third switch, comprising:
a first terminal coupled to the bulk of the first output transistor;
a control terminal coupled to the second terminal of the first switch; and
a second terminal coupled to the first operational voltage;
a fourth switch including a first terminal coupled to the first switch and a second terminal coupled to the second switch and the fourth switch is controlled by the first operational voltage, and
a fifth switch, wherein the fifth switch comprising:
a first terminal coupled to the bulk of the first output transistor;
a control terminal coupled to the first operational voltage; and
a second terminal coupled to the second terminal of the first output transistor.

12. The output buffer according to claim 11, wherein when the enable signal has a first level, the first switch is turned off and the second switch is turned on to pass the second operational voltage to turn on the third switch so that the bulk of the first output transistor has a bulk voltage equal to the first operational voltage.

13. The output buffer according to claim 12, wherein when the enable signal has a second level and a high voltage larger than the first operational voltage is applied to the second terminal of the first output transistor to lift up the bulk voltage toward the high voltage, the second switch is turned off and the first switch is turned on to pass the bulk voltage to turn off the third switch.

14. The output buffer according to claim 13, wherein when the enable signal has the first level, the fourth switch is turned on and when the enable signal has the second level, the fourth switch is turned off.

15. The output buffer according to claim 14, wherein when the enable signal has the first level, the fifth switch is turned off and when the enable signal has the second level, the fifth switch is turned on to pass the high voltage to the bulk of the first output transistor.

16. The output buffer according to claim 13, further comprising:
a first transistor, comprising:
a first terminal coupled to the bulk of the first output transistor;
a control terminal receiving the enable signal; and
a second terminal coupled to a control terminal of the first output transistor; and
a second transistor, comprising:
a first terminal coupled to the bulk of the first output transistor;
a control terminal receiving the input data; and
a second terminal coupled to the control terminal of the first output transistor, wherein a bulk of the first transistor and a bulk of the second transistor are coupled to the bulk of the first output transistor.

17. The output buffer according to claim 16, further comprising:
a third transistor, comprising:
a first terminal coupled to the control terminal of the first output transistor; and
a control terminal receiving an inverted signal of the enable signal;
a fourth transistor, comprising:
a first terminal coupled to a second terminal of the third transistor; and
a control terminal receiving the enable signal; and
a second output transistor, comprising:
a first terminal coupled to the second terminal of the first output transistor;
a control terminal coupled to a second terminal of the fourth transistor; and
a second terminal coupled to the second operational voltage, wherein a bulk of the third transistor is coupled to the bulk of the first output transistor.

18. The output buffer according to claim 17, wherein when the enable signal has the first level, the third transistor and the fourth transistor are turned on, and when the enable signal has the second level and the high voltage is applied to the second terminal of the first output transistor, the fourth transistor is turned off to block the bulk voltage from inputting to the control terminal of the second output transistor to turn on the second output transistor.

19. The output buffer according to claim 17, wherein the fourth transistor is a native transistor having a threshold voltage substantially equal to 0.

20. The output buffer according to claim 17, further comprising a boost circuit coupled to the control terminal of the fourth transistor, wherein when the enable signal has the second level, the boost circuit outputs the second operational voltage to the control terminal of the fourth transistor to turn off the fourth transistor, and when the enable signal has the first level and the input data has a low level, the boost circuit outputs a voltage to completely turn on the fourth transistor so that the fourth transistor outputs the first operational voltage.

* * * * *